United States Patent [19]

Kondo et al.

[11] Patent Number: 5,018,001
[45] Date of Patent: May 21, 1991

[54] ALUMINUM LINE WITH CRYSTAL GRAINS

[75] Inventors: Kenji Kondo, Hoi; Kazuo Akamatsu, Okazaki; Takeshi Yamauchi, Oobu; Tooru Yamaoka, Oobu; Atsushi Komura, Oobu, all of Japan

[73] Assignee: Nippondenso Co., Ltd., Kariya, Japan

[21] Appl. No.: 442,669

[22] Filed: Nov. 29, 1989

[30] Foreign Application Priority Data

Dec. 15, 1988 [JP] Japan ................................ 63-317161
Aug. 24, 1989 [JP] Japan ................................ 1-218397

[51] Int. Cl.$^5$ ........................................... H01L 23/48
[52] U.S. Cl. ........................................ 357/67; 357/65; 357/71; 437/957; 428/469; 428/472
[58] Field of Search ........................... 357/67, 65, 71; 428/469, 472; 437/957

[56] References Cited

U.S. PATENT DOCUMENTS

| | | | |
|---|---|---|---|
| 3,743,894 | 7/1973 | Hall et al. | 357/67 |
| 4,726,983 | 2/1988 | Harada et al. | 428/469 X |
| 4,823,182 | 4/1989 | Okumura | 357/71 X |
| 4,845,050 | 7/1989 | Kim et al. | 357/71 X |

FOREIGN PATENT DOCUMENTS 61-216444  9/1986  Japan .
61-267348  11/1986  Japan .
62-18023  1/1987  Japan .

OTHER PUBLICATIONS

Nikkei Microdevices, pp. 85–100, 1986.
IEEE 23rd Annual Proceedings Reliability Physics 1985, pp. 108–114, Hang et al., Breakdown Energy of Metal.

Primary Examiner—William Mintel
Assistant Examiner—Roy Potter
Attorney, Agent, or Firm—Cushman, Darby & Cushman

[57] ABSTRACT

An aluminum line including nitrogen formed as a film in a semiconductor integrated circuit is disclosed. Each crystal grain size of the aluminum line is lower than or equal to 0.3 μm to suppress electromigration. A method of forming the aluminum line which can supress electromigration is also disclosed. The amount of an inert gas Q and the amount of a nitrogen gas $Q_N$ are controlled to satisfy "$2 \leq (Q_N/Q) \times 100 \leq 10$".

17 Claims, 8 Drawing Sheets

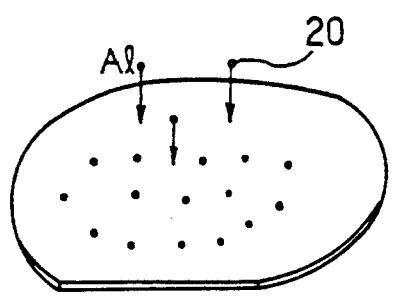
FIG. 7A — Early stage
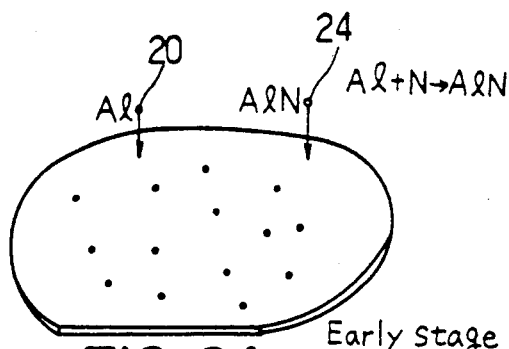
FIG. 8A — Early Stage
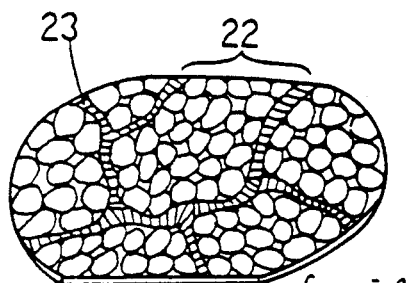
FIG. 7B — Growing stage of nucleus
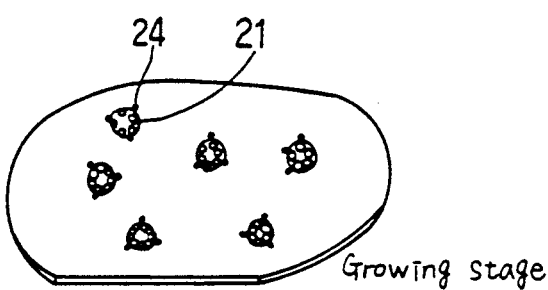
FIG. 8B — Growing stage of nucleus
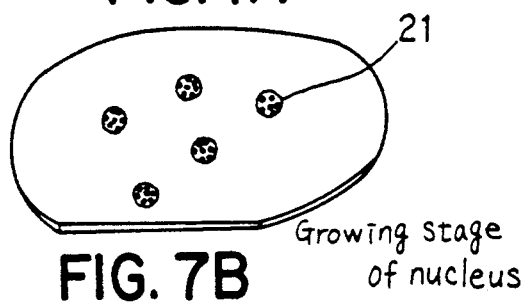
FIG. 7C — Growing stage of film
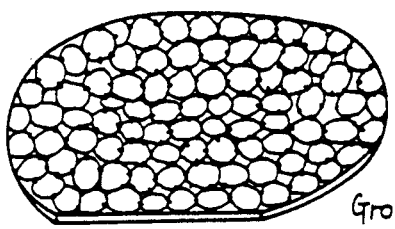
FIG. 8C — Growing stage of film
FIG. 9
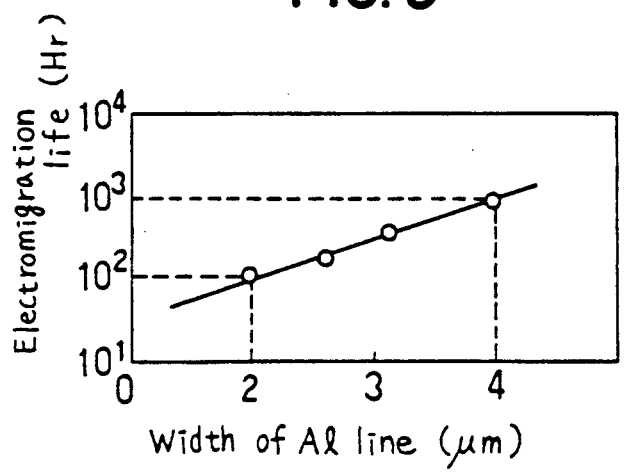

33

33

33

ALUMINUM LINE WITH CRYSTAL GRAINS

BACKGROUND OF THE INVENTION

The present invention relates to an aluminum line formed as a film on a semiconductor substrate and a method of forming the same.

Stress migration is known as a phenomenon which causes the breaking of the aluminum line and the occurrence of a void. Electromigration is also known as a phenomenon which causes the breaking of the aluminum line.

The achieving of high integration and high speed in semiconductor integrated circuits has recently become highly desirable. High integration and high speed require the use of specialized techniques for microminiaturization and multi-metal-layer lamination in a line structure. Microminiaturization of the line structure necessitates the design of the aluminum line of much narrower width than has previously been attained. Each aluminum line of the multi-metal-layer line structure has its narrowest part at a point where its rank (which layer it is in) changes or at a through hole, resulting in a reduction of its sectional area. However, a reduction of the sectional area of the line causes an increased current density which leads to the phenomena-known as electromigration, which shortens an aluminum line's life. A FIG. 9 shows the relationship between the width of the aluminum line and the electromigration life of a device made using an Al-Si line formed by an S-Gun apparatus. The relationship shown in FIG. 9 is an experimental result at 150° C. when a current of 16 mA is supplied to the Al-Si line whose thickness is 0.9 $\mu$m. Usually, the width of a line is about 4 $\mu$m and the line's life is about $10^3$ hours. A device which can have practical use is almost impossible if the width of an line is narrower than 2 $\mu$m, since an increased current density makes the line's life about $10^2$ hours. Hence, in order to suppress electromigration, copper or titanium have been added to an Al-Si alloy line, thus providing an Al-Si-Cu alloy line or Al-Si-Ti alloy line respectively.

However, while those aluminum alloy lines can suppress electromigration to a certain degree, they can not suppress it beyond this certain degree.

SUMMARY OF THE INVENTION

An object of the present invention is to provide an aluminum line and a method of forming the same in a semiconductor integrated circuit which can reduce electromigration.

Another object of the present invention is to provide an aluminum line and a method of forming the same in a semiconductor integrated circuit which can lengthen the life of the line.

In the present invention, an aluminum line is formed as a film on a semiconductor substrate, the aluminum line containing nitrogen and the grain size of the crystals thereof being controlled under 0.3 $\mu$m.

Further, a barrier metal is sandwiched between the aluminum line and the semiconductor substrate, which prevents the aluminum from diffusing into the semiconductor substrate.

Further, a method of forming the aluminum line is to accumulate a film of the aluminum on a semiconductor substrate, by use of a sputtering method which includes inert gas and nitrogen gas in a vacuum chamber having the semiconductor substrate and a target and which is controlled to satisfy the following condition:

$$2 \leq (Q_N/QW_{Ar}) \times 100 \leq 10 \qquad (1)$$

where $Q_{Ar}$ is the mass of flow inert gas and $Q_N$ is the mass flow of nitrogen gas.

Since the sputtering method is controlled to satisfy said equation (1), the crystal grain size of the aluminum line is controlled under 0.3 $\mu$m by the influence of aluminum nitrides.

In this case, when the crystal grain size of the aluminum line is set to under 0.3 $\mu$m, the movement of Al atoms is suppressed. Thus, electromigration can be suppressed.

Further, when the barrier metal is sandwiched between the aluminum line and the semiconductor substrate, the barrier metal prevents from the occurrence of the so-called alloy spike.

BRIEF DESCRIPTION OF THE DRAWINGS

These and other objects and advantages of this invention will become more apparent and more readily appreciated from the following detailed description of the presently preferred exemplary embodiments of the invention taken in conduction with the accompanying drawings, of which:

FIGS. 7A, 7B and 7C are schematic views for describing the film growing mechanism of the aluminum line of the related art.

FIGS. 8A, 8B and 8C are schematic views for describing the film growing mechanism of the present invention;

FIG. 9 is a view showing the relationship between the width of the aluminum line and the electromigration life;

DETAILED DESCRIPTION OF THE PREFERRED EMBODIMENTS

Figure 1:
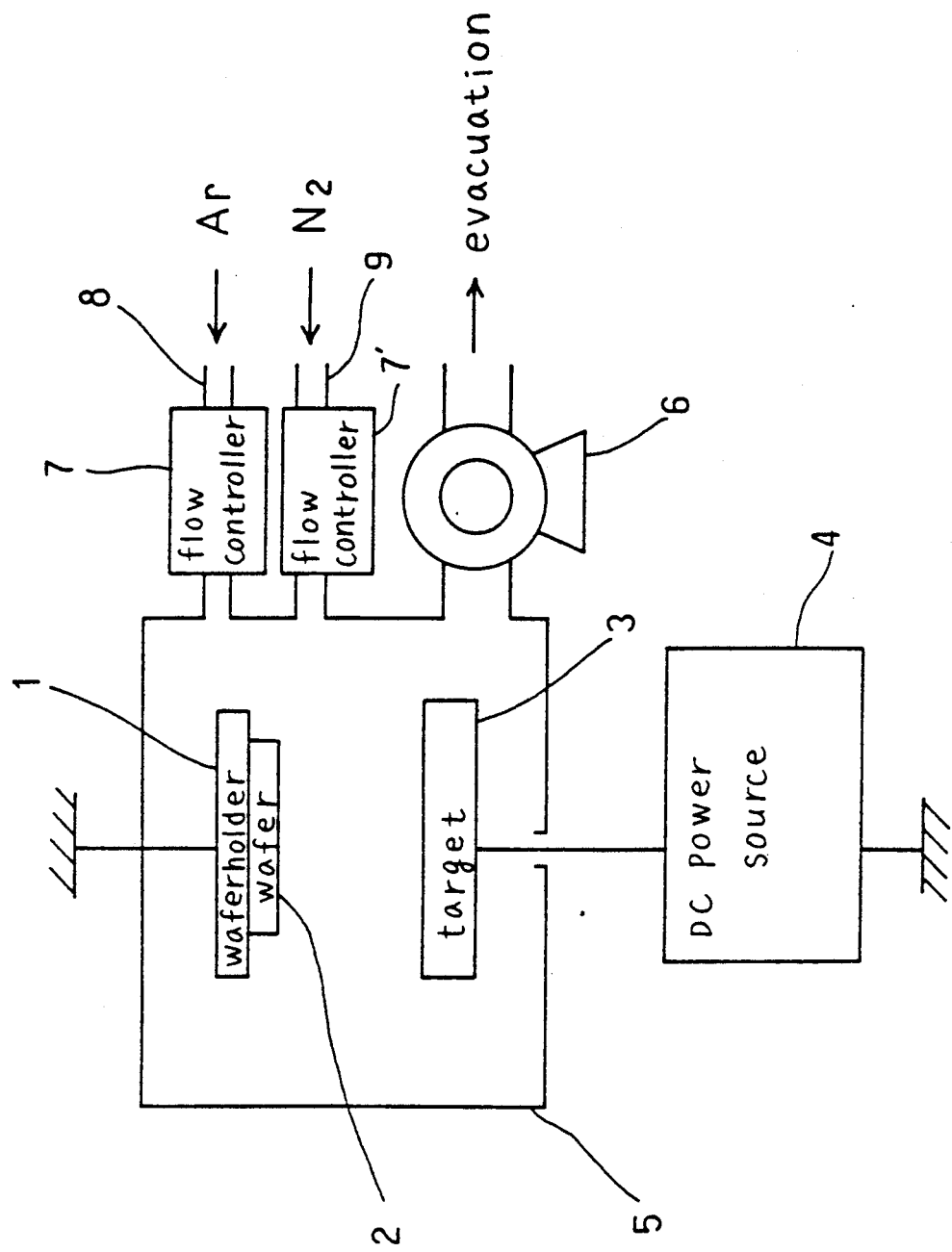
FIG. 1 is a view showing a schematic construction of a sputtering apparatus according to a first embodiment of the present invention.

FIG. 1 shows the schematic construction of a sputtering apparatus. Waferholder 1 holds semiconductor wafer 2 as a substrate. Semiconductor device is formed on semiconductor wafer 2. An oxide film which has openings is formed on the surface of the semiconductor device. Target 3 which consists of Al-Si is set face to face with waferholder 1, and is electrically connected to DC power source 4. Chamber 5 having waferholder 1 semiconductor wafer 2 and target 3 inside is evacuated by vacuum pump 6.

After evacuating the inside of chamber 5, the flow rate of Ar gas and $N_2$ gas which flow into chamber 5 through gas entrances 8 and 9 respectively are controlled by flow controllers trollers 7 and 7'. The flow rate of $N_2$ gas and Ar gas are controlled to satisfy the following condition:

$$2 \leq (Q_N/Q_{Ar}) \times 100 \leq 10 \quad (1)$$

where $Q_{Ar}$ is the mass flow of Ar gas and $Q_N$ is the mass flow of $N_2$ gas.

After controlling the flow rate of $N_2$ gas and Ar gas which flow into chamber 5, a reactive sputtering is carried out by impressing a high voltage between waferholder 1 and target 3. Thus, a thin film of Al-Si-N is formed on the surface of semiconductor wafer 2 by use of the reactive sputtering.

Figure 2:
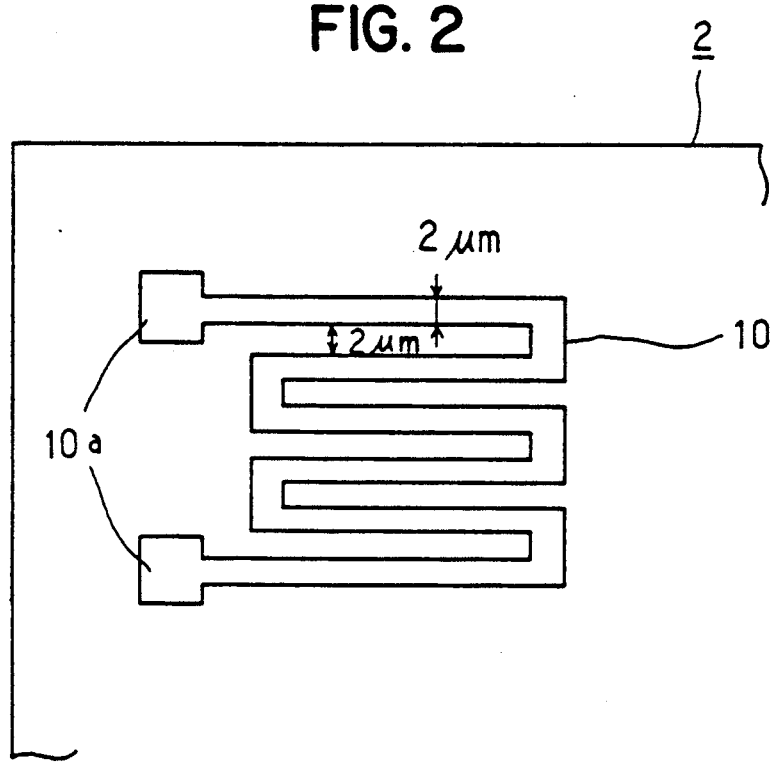
FIG. 2 is a view from above showing a test pattern on a semiconductor wafer according to a first embodiment of the present invention.

The thin film of Al-Si-N is photolithographed to form a line pattern. FIG. 2 shows a test pattern of an aluminum line with the width of 2 microns and the length of 3 millimeters formed on the semiconductor wafer 2 to carry out a characteristic test which will be described later on.

After forming a passivation film on the surface of the test pattern, an opening is made at each pad 10a by using photolithography. The test pattern with the semiconductor wafer 2 is packed in a ceramic package, each pad 10a is electrically connected to predetermined terminals by use of a wire bonding method, and thus, a semiconductor device is formed.

The conditions of the sputtering method used in the first embodiment is defined not only by the equation (1) but also in a table 1. The experimental results in the case of the test pattern of the aluminum line 10 is formed by a sputtering device of ULVAC corporation are compared with the experimental results in the case of the same by a sputtering device of VARIAN corporation.

TABLE 1

| Item | Manufacturer | |
|---|---|---|
| | ULVAC CO. | VARIAN CO. |
| | Type of the suffering defice | |
| | MLH-2306RDG | 3290 |
| Temperature of the substrate (°C.) | 25 | 25 |
| Distance between anode and anode and cathode (°C.) | 50 | 57 |
| Diameter of the target (inch) | 6 | 10 |
| Electric power (kw) | 0.5 | 4.8 |
| Pressure (mtorr) | 0.9 | 7.0 |

Figure 3:
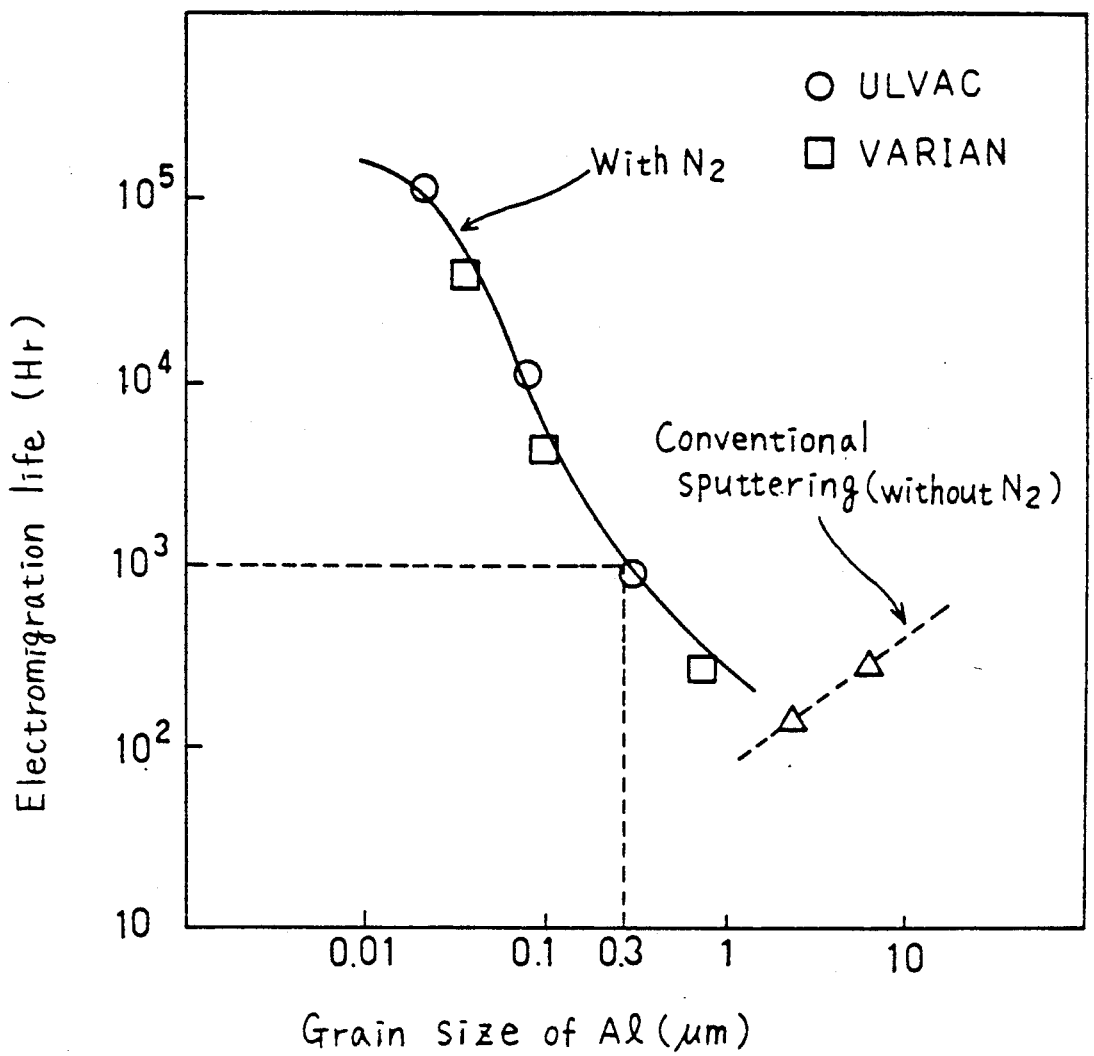
FIG. 3 is a view showing the relationship between the grain size of aluminum and the electromigration life.

Characteristics of the aluminum line 10 are explained by inventors' experimental results which are shown in FIG. 3, FIG. 4, FIG. 5 and FIG. 6. FIG. 3 is the experimental result when the electricity is supplied to aluminum line 10 which is 0.9 μm thick under conditions of 16 mA of current, 150° C. of temperature and $1 \times 10^6$ A/cm$^2$ of current density.

Figure 4:
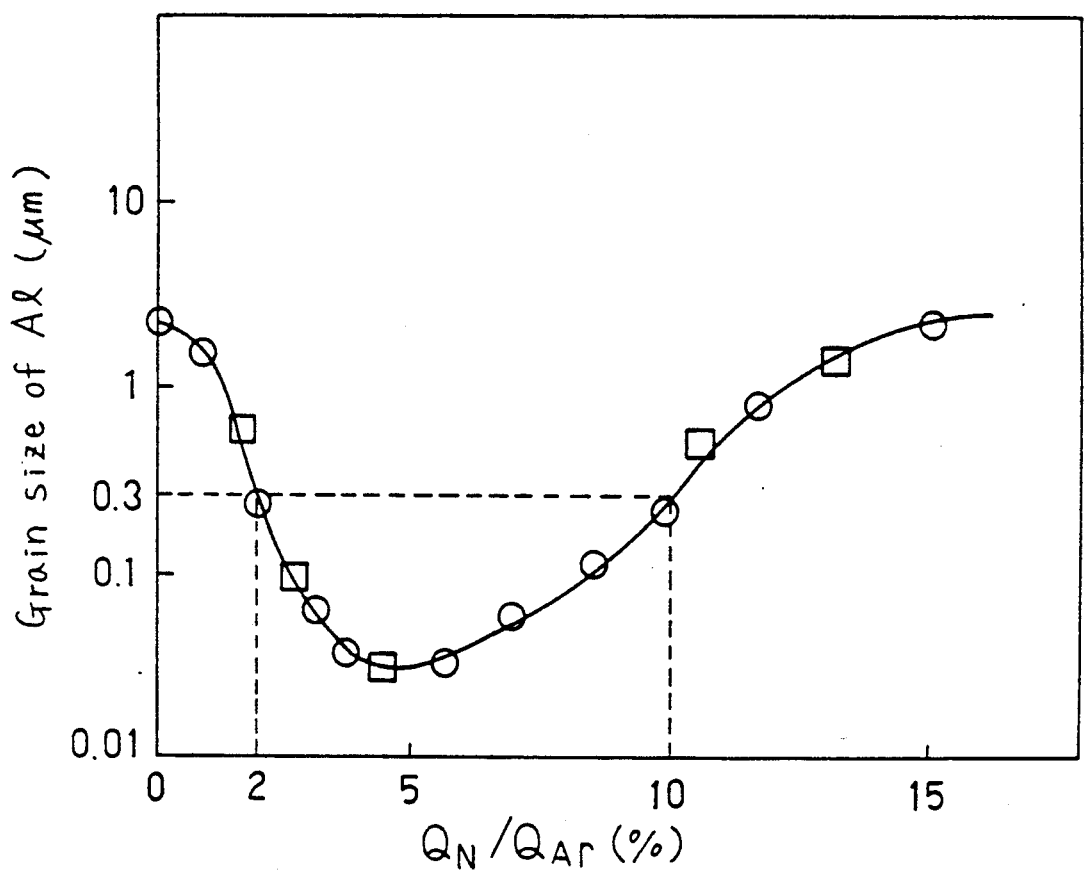
FIG. 4 is a view showing the relationship between $Q_N/Q_{AR}$ and the grain size of aluminum line.
Figure 5:
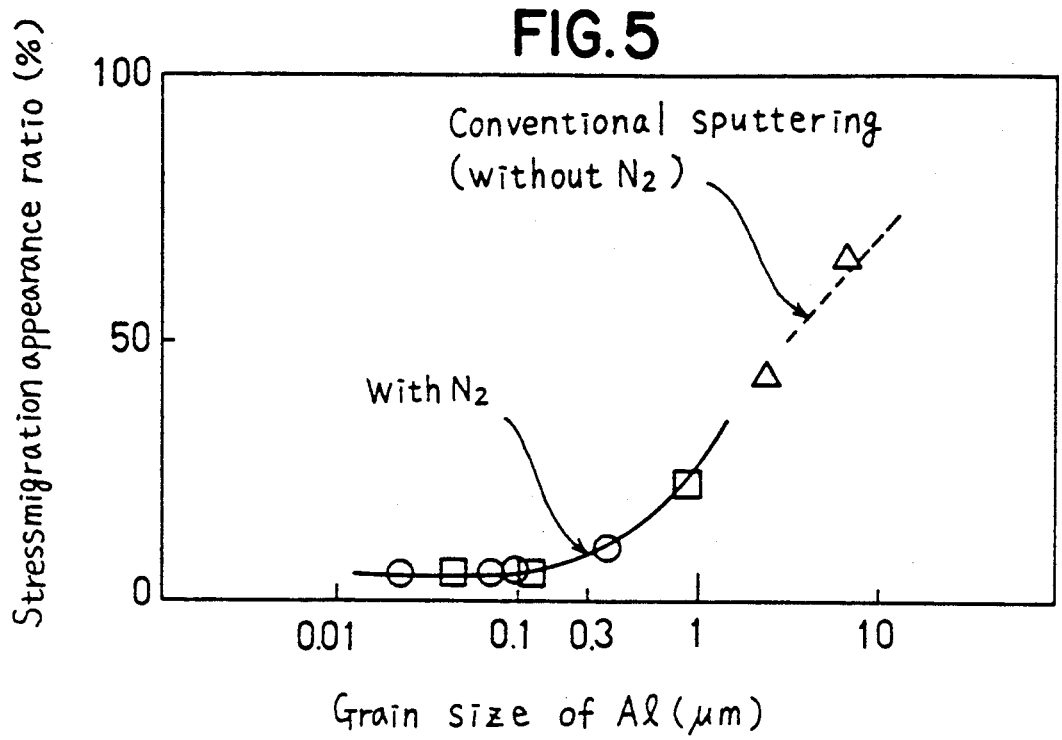
FIG. 5 is a view showing the relationship between the grain size of aluminum and the stress migration appearance ratio.

In FIG. 3, FIG. 4 and FIG. 5, O represents the characteristic of the aluminum line 10 when the sputtering device of ULVAC corporation is used, and □ represents the same when the sputtering device of VARIAN corporation is used.

In FIG. 3 and FIG. 5, Δ represents the characteristic values of the aluminum line 10 without adding $N_2$ gas.

Figure 6:
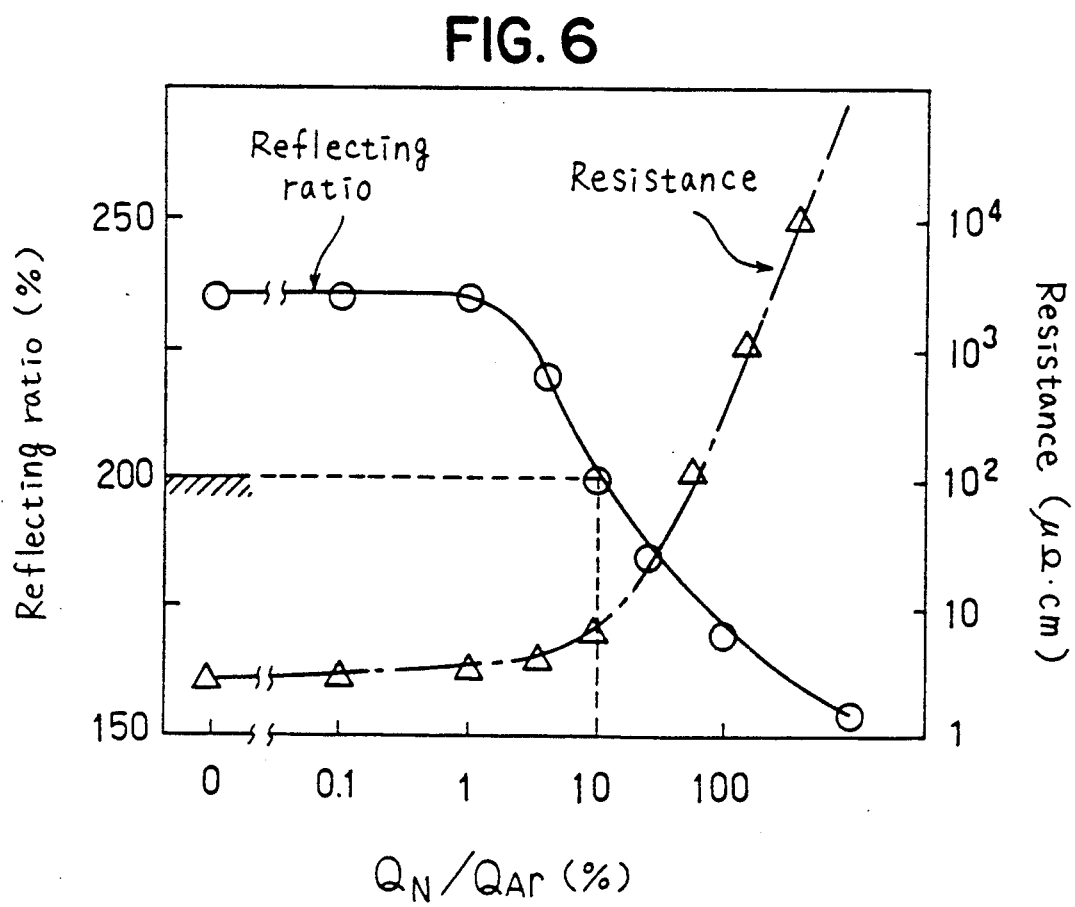
FIG. 6 is a view showing the relationship between $Q_N/Q_{Ar}$ and reflecting ratio and resistance.

FIG. 6 shows characteristics of the aluminum line 10 when the sputtering device of ULVAC corporation is used.

FIG. 4 shows the relationship between $Q_N/Q_{Ar}$ (%) and the grain size of aluminum line 10, where $Q_{Ar}$ is the mass flow of Ar gas and $Q_N$ is the mass flow of $N_2$ gas. As is apparent from FIG. 4, in the case of "$2(\%) \leq (Q_N/Q_{Ar}(\%)) \times 100 \leq 10(\%)$" the grain size of aluminum line 10 becomes 0.3 μm or less.

FIG. 3 shows the relationship between the grain size of aluminum line 10 and the electromigration life. The definition of the electromigration life is a mean expected life of the aluminum line when the electromigration causes a breaking of the aluminum line.

As is apparent from FIG. 3, in the case of the grain size of aluminum line 10 being under 0.3 μm, the electromigration life becomes as long as 1000 hours. Comparing the experimental results of the first embodiment to the characteristic shown in FIG. 9, it can be seen that though the aluminum line with the characteristic of FIG. 9 needs 4 μm of line width to get 1000 hours of expected electromigration life, the first embodiment can get 1000 hours of electromigration life with 2 μm of the line width and much longer life can be attained.

FIGS. 7A, 7B and 7C are schematic views for describing the inventors' theory of the film growing mechanism of the aluminum line of the related art. FIGS. 8A, 8B and 8C are schematic views for describing the inventors' theory of the film growing mechanism of the present invention.

FIGS. 7A and 8A show each early stage, FIGS. 7B and 8B show each growing stage of nucleus and FIGS. 7C and 8C show each growing stage of film.

In the mechanism of the related art, aluminum atoms 20 are accumulated on the wafer by the use of the sputtering method in the early stage shown in FIG. 7A. By continuing to use the sputtering method, Al atoms 20 grow to first particles 21 in the growing stage of nucleus shown in FIG. 7B, and finally, first particles 21 grow and are combined to form second particles 22 in the growing stage of film shown in FIG. 7C. Grain boundary 23 is formed between a second particle 22 and another second particle 22.

In the postulated mechanism of the first embodiment, aluminum atoms 20 and aluminum nitride (AlN) 24 are accumulated on the wafer by the use of the sputtering method in the early stage shown in FIG. 8A. By continuing to use the sputtering method, Al atoms 20 grow to first particles 21 while AlN 24 move to the surface of first particles 21 in the growing stage of the nuclei shown in FIG. 8(b). In the growing stage of film shown in FIG. 8C, second particles are not produced because of the influence of AlN 24, and finally, the film is formed keeping the density of the film high.

It has been considered generally that electromigration might occur because of the movement of Al through grain boundaries 23. In the related art, antielectronigration was achieved by reducing the area of grain boundary 23. To reduce the area of grain boundary 23, the grain size of second particle 22 was enlarged as large as possible. In the related art, however, since the grain boundary 23 still exists after reducing the area of grain boundary 23, the suppression of electromigration has the previously discussed limit.

Compared with this related art, the first embodiment can suppress more electromigration since it has fewer grain boundaries 23 produced by second particles 22.

Now, some concrete values in the first embodiment are shown in table 2 when the flow rate of Ar gas and $N_2$ gas which flow into chamber 5 is changed.

In table 2, sample A is the aluminum line formed by a sputtering device of ULVAC corporation, and sample B is the one formed by a sputtering device of VARIAN corporation. Other conditions of the sputtering method are the same as those described previously.

TABLE 2

| | | Manufacturer | |
|---|---|---|---|
| | | VLVAC CO. | VARIAN CO. |
| | | Sample | |
| Item | | Sample A | Sample B |
| Mass flow of gas | $N_2$ (cc/min) | 0.525 | 3 |
| | Ar (cc/min) | 15 | 100 |
| | $N_2$/Ar(%) | 3.5 | 3 |

The grain size of the surface of the line, the grain size of the inside of the line and electromigration life of the sample A and the sample B are shown in table 3.

The grain size of the inside of the line was measured after making the line's thickness half by using the phosphoric etching.

TABLE 3

| | | Sample A | Sample B |
|---|---|---|---|
| The grain size of | Surface | 0.07 ± 0.03 | 0.1 ± 0.05 |
| Al in Al-Si-N (μm) | Inside | 0.08 ± 0.02 | 0.1 ± 0.05 |
| Electromigration life (Hr) | | $1 \times 10^4$ | $5 \times 10^3$ |

Comparative examples

The grain size of the line's surface, the grain size of the inside of the line and electromigration life of comparative example 1 and 2 in the case of the aluminum line is formed without $N_2$ gas under the conditions of table 1 and 2 are shown in table 4.

TABLE 4

| | | Manufacturer | |
|---|---|---|---|
| | | ULVAC CO. | VARIAN CO. |
| | | Comparative | Comparative |
| Item | | example 1 | example 2 |
| The grain size | Surface | 0.13 ± 0.05 | 0.15 ± 0.05 |
| of Al in | Inside | 1.30 ± 0.90 | 2.10 ± 1.30 |
| Al-Si (μm) | | | |
| Electromigration life (Hr) | | $2 \times 10^2$ | $1.5 \times 10^2$ |

When table 4 is compared with table 3, the grain size of the surface of the line is comparatively large and the grain size of the line's inside is quite large in the case of the line is formed without $N_2$ gas (Table 4).

Compared with that, the grain size of the surface and the inside of the line is comparatively small when the ratio of the flow rate of Ar gas and $N_2$ gas is controlled as shown in table 3. Electromigration life shown in table 3 is lengthened to be more than 25 times as long as the one shown in table 4. It will be understood from table 2, table 3 and FIG. 4, that the relationship between the ratio of the flow rate of the gas and the grain size of Al does not depend on the sputtering device.

FIG. 5 shows the relationship between the grain size of the Al crystal and the occurrence ratio of the stress migration caused by the stress of the passivation film and the like.

In the first embodiment, the grain size of the line's surface and inside is controlled to be less than 0.3 μm by controlling the ratio of the flow rate of Ar gas and $N_2$ gas. Thus, it will be understood from FIG. 5 that the first embodiment can reduce the occurrence rate of stress migration.

FIG. 6 shows the relationship between the ratio of the flow rate of Ar gas and $N_2$ gas ($Q_N/Q_{Ar}(\%)$) and the reflecting ratio and the resistance of the aluminum line. The reflecting ratio is defined as the intensity of the reflected light from the aluminum line when the intensity of the reflected light from the raw ore of silicon is defined as 100%.

As is shown in FIG. 6, a satisfactory reflecting ratio when a masking with an exposure of the aluminum film is executed is achieved, also the resistance of the aluminum line can be suppressed below 10 μΩcm by controlling the ratio of the flow rate of Ar gas and $N_2$ gas.

Figure 10:
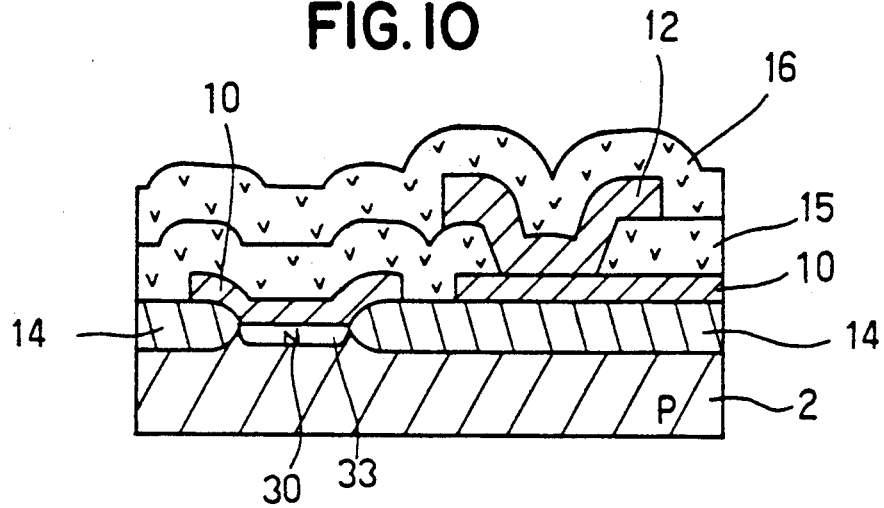
FIG. 10 is a sectional view showing the application of the present invention.

FIG. 10 shows the application of the aluminum line described in the first embodiment to a MOS transistor which has source or drain 30. So-called Locos(Local Oxidation of Silicon) is used to form $SiO_2$ 14 on semiconductor wafer 2. After forming source or drain 30, aluminum line 10 which is described above is formed. Passivation film 15, 16 such as $SiO_2$, BPSG or PSG and aluminum line 12 are formed on aluminum line 10.

Figure 11:
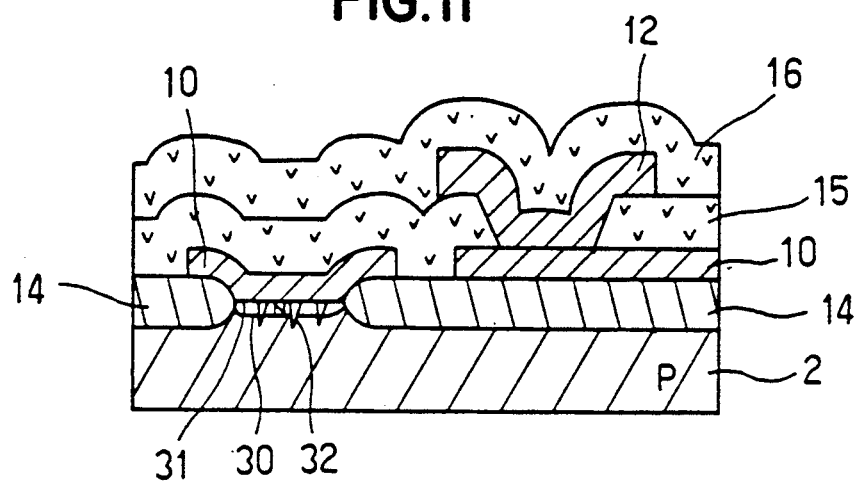
FIG. 11 is a sectional view showing the occurring condition of alloy spike.

An alloy spike 32 shown in FIG. 11, having a possibility of causing a short circuit between aluminum line 10 and semiconductor wafer 2 has occurred in the related art under certain circumstances. This is believed to be caused by a diffusion of aluminum into silicon.

Usually, approximately 1% of silicon is added to aluminum line 10 to prevent the occurrence of the alloy spike.

However, when $N_2$ gas is used in the reactive sputtering like the first embodiment, it is considered that the amount of silicon contained in aluminum line 10 is decreased since 1% of silicon reacts on nitrogen and turns into SiN. It is also considered that the decrease of the amount of silicon weakens the effect of preventing the occurrence of the alloy spike.

FIG. 11 shows the occurring state of alloy spike when aluminum line 10 is formed on source or drain 30 of MOS transistor. In the first embodiment described above, since aluminum line 10 is formed on semiconductor wafer 2 directly, alloy spike 32 is formed at contact part 31 as shown in FIG. 11 when aluminum line 10 is formed on source or drain 30 of MOS transistor.

Figure 12:
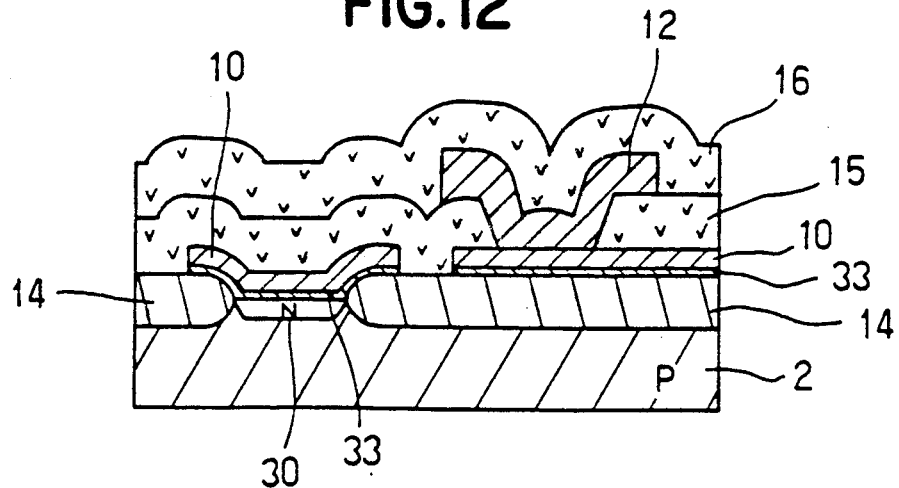
FIG. 12 is a sectional view showing the construction of a semiconductor device with an aluminum line according to a second embodiment of the present invention.

FIG. 12 shows the second embodiment of the present invention which has an object to prevent the occurrence of the alloy spike. The same reference numerals as in the first embodiment denote the same parts in this second embodiment.

In this second embodiment, barrier metal 33 is formed between aluminum line 10 and source or drain 30 to easily prevent the outbreak of the alloy spike.

Figure 13:
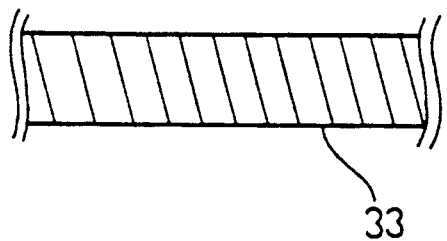
Figure 14:
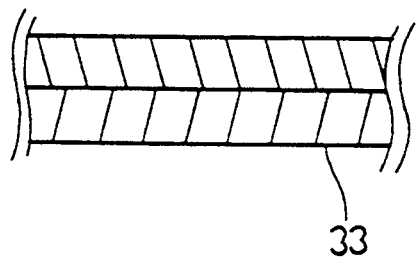
Figure 15:
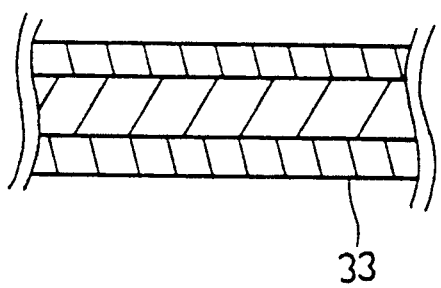

Barrier metal 33 is composed of 1-layer structure of titanium tungsten(TiW) shown in FIG. 13, a 2-layer structure of TiN/Ti shown in FIG. 14, or a 3-layer structure of Ti/TiN shown in FIG. 15.

A method of forming barrier metal 33 is, for example, to use a sputtering method with a target of TiW when the layer of TiW is formed. In the case of the 2-layer structure of TiN/Ti, barrier metal 33 is formed by annealing Ti in $N_2+NH_3$ atmosphere after sputtering Ti.

The process of annealing Ti in $N_2+NH_3$ atmosphere can be replaced by a process of forming TiN by use of reactive sputtering method.

In the case of the 3-layer structure of Ti/TiN/Ti, barrier metal 33 is formed by sputtering Ti after forming TiN/Ti as described above.

Resistance of the 3-layer structure of Ti/TiN/Ti is lower than that of the 2-layer structure of TiN/Ti.

Also in the case of the 3-layer structure of Ti/TiN/Ti, the crystal axis of the aluminum line 10 can be oriented to the (111) plane as shown in Japanese laid-open patent 63-152147 by forming aluminum line 10 directly on Ti.

The content of the target employed in the embodiments described above may be Al-Si, and Al-Si-Cu may be used instead applied.

Long-life aluminum line can be acquired by controlling the grain size of aluminum adding $N_2$ gas when the sputtering method is used, and does not depend on the content of the target except aluminum.

Though there is no lower limit of the grain size of aluminum, it may be about 0.03 μm which is the lower limit of the work control value.

A magnet may be positioned behind target 3 shown in FIG. 1 to get a high efficiency of sputtering in a general sputtering device. However it may be eliminated.

Some exemplary embodiments of this invention have been described in detail above, but those skilled in the art will readily appreciate that many modifications are possible in the preferred embodiments without materially departing from the novel teachings and advantages of this invention. Accordingly, all such modifications are intended to be included within the scope of this invention as defined by the following claims.

What is claimed is:

1. An aluminum film line formed on a substrate comprising:
   a plurality of crystal grains made up of plural aluminum atoms and formed on a substrate; and
   a plurality of aluminum nitrides formed at multiple surfaces of said crystal grains so that a size of said crystal grains is less than or equal to 0.3 μm in all directions.

2. An aluminum line according to claim 1, wherein said substrate is a semiconductor substrate.

3. An aluminum line according to claim 2, wherein said semiconductor substrate includes silicon.

4. An aluminum line according to claim 3, further comprising a barrier layer which prevents said aluminum from diffusing into said semiconductor substrate, formed between said semiconductor substrate and said aluminum line.

5. An aluminum line according to claim 4, wherein said barrier layer comprises a metal.

6. An aluminum line according to claim 5, wherein said metal includes titanium.

7. An aluminum line according to claim 5, wherein said metal comprises a titanium tungsten.

8. An aluminum line according to claim 5, wherein said metal comprises a 2-layer structure of a titanium and a titanium nitride respectively.

9. An aluminum line formed as a film comprising:
   a semiconductor substrate which includes silicon;
   an aluminum line including nitrogen formed as a film on said substrate, said line including mainly aluminum, each crystal grain size of said aluminum line being less than or equal to 0.3 μm;
   a barrier layer which prevents said aluminum from diffusing into said semiconductor substrate, formed between said semiconductor substrate and said aluminum line;
   wherein said barrier layer comprises a metal which includes titanium, wherein said metal comprises a 3-layer structure, wherein said three layers are a titanium, a titanium nitride, and a titanium, respectively.

10. An aluminum film line formed on a substrate comprising:
    an aluminum line made up of a plurality of aluminum crystal grains formed on said substrate by continuously adding an inert gas and a nitrogen gas in a way such that a percentage of the nitrogen gas compared to the inert gas is in a range between 2 percent and 10 percent and so that the size of said crystal grains are less than or equal to 0.3 μm in all directions.

11. An aluminum line according to claim 10, wherein said substrate is a semiconductor substrate.

12. An aluminum line according to claim 11, further comprising a barrier layer which prevents said aluminum from diffusing into said silicon of said substrate, formed between said substrate and said aluminum line.

13. An aluminum line according to claim 12, wherein said barrier layer comprises a metal.

14. An aluminum line according to claim 13, wherein said metal includes titanium.

15. An aluminum line according to claim 13, wherein said metal comprises a titanium tungsten.

16. An aluminum line according to claim 13, wherein said metal comprises a 2-layer structure of a titanium and a titanium nitride, respectively.

17. An aluminum line formed as a film, comprising:
    a substrate;
    an aluminum line formed on said substrate including aluminum-X-nitrogen formed by adding an inert gas and nitrogen gas in a way such that a ratio of the inert gas to the nitrogen gas, times 100 is between 2 and 10, and where X is a material of said substrate which comprises silicon;
    a barrier layer which prevents said aluminum from diffusing into said silicon of said substrate, formed between said substrate and said aluminum line, said barrier layer comprising a metal which includes titanium, wherein said metal comprises a 3-layer structure, wherein said three layers are a titanium, a titanium niride, and a titanium, respectively.

* * * * *